US012700872B2

(12) United States Patent
Sahu et al.

(10) Patent No.: US 12,700,872 B2
(45) Date of Patent: *Aug. 4, 2026

(54) SUCCESSIVE APPROXIMATION REGISTER ANALOG-TO-DIGITAL CONVERTER WITH EMBEDDED FILTERING

(71) Applicant: Texas Instruments Incorporated, Dallas, TX (US)

(72) Inventors: Debapriya Sahu, Bengaluru (IN); Pranav Sinha, Bengaluru (IN); Meghna Agrawal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 117 days.

This patent is subject to a terminal disclaimer.

(21) Appl. No.: 18/535,445

(22) Filed: Dec. 11, 2023

(65) Prior Publication Data

US 2024/0113724 A1 Apr. 4, 2024

Related U.S. Application Data

(63) Continuation of application No. 17/893,076, filed on Aug. 22, 2022, now Pat. No. 11,888,497, which is a (Continued)

(51) Int. Cl.
$H03M\ 1/06$ (2006.01)
$H03M\ 1/18$ (2006.01)
$H03M\ 1/46$ (2006.01)

(52) U.S. Cl.
CPC ......... *H03M 1/462* (2013.01); *H03M 1/0626* (2013.01); *H03M 1/182* (2013.01); *H03M 1/468* (2013.01)

(58) Field of Classification Search
CPC ...... H03M 1/468; H03M 1/462; H03M 1/804; H03M 1/466; H03M 1/68; H03M 1/12; H03M 1/1245; H03M 1/46; H03M 1/1038; H03M 1/1071; H03M 1/00; H03M 1/1047; H03M 1/1061; H03M 1/0682;
(Continued)

(56) References Cited

U.S. PATENT DOCUMENTS 3,906,488 A * 9/1975 Suarez-Gartner ....... H03M 1/02
341/172
6,486,806 B1 11/2002 Munoz
(Continued)

*Primary Examiner* — Linh V Nguyen
(74) *Attorney, Agent, or Firm* — Michelle F. Murray; Frank D. Cimino

(57) ABSTRACT

An analog-to-digital converter (ADC) includes a switched capacitor circuit, a comparator, and a control circuit. The switched capacitor circuit has a switch control input and an output, and includes switches coupled to the switch control input and coupled to capacitors. The comparator has an input coupled to the output of the switched capacitor circuit and has an output. The control circuit has a switch control output coupled to the switch control input, has an input coupled to the output of the comparator, and provides switch control signals at the switch control output. Responsive to the switch control signals, the switched capacitor circuit provides an output signal to the comparator that is based on a sample of an analog input signal acquired in a sample acquisition cycle and based on a digital sample value output by the ADC prior to the sample acquisition cycle.

20 Claims, 5 Drawing Sheets

Related U.S. Application Data continuation of application No. 17/007,887, filed on Aug. 31, 2020, now Pat. No. 11,424,756.

(58) Field of Classification Search
CPC ...... H03M 1/002; H03M 1/08; H03M 1/1033; H03M 1/145; H03M 1/1042; H03M 1/14; H03M 1/38
USPC ................. 341/118–120, 155, 161, 162, 172
See application file for complete search history.

(56) References Cited

U.S. PATENT DOCUMENTS

| | | | |
|---|---|---|---|
| 6,603,415 B1 | 8/2003 | Somayajula | |
| 7,439,898 B1 | 10/2008 | Nittala | |
| 8,502,723 B2 | 8/2013 | Chen | |
| 9,100,034 B2 | 8/2015 | Oshima | |
| 9,559,716 B1 | 1/2017 | Matsui | |
| 9,793,912 B1 | 10/2017 | Ferris | |
| 10,110,247 B1 * | 10/2018 | Baringer | H04B 1/16 |
| 10,243,577 B1 * | 3/2019 | Berens | H03M 1/1042 |
| 10,333,543 B1 * | 6/2019 | Hurrell | H03M 1/462 |
| 10,491,233 B1 * | 11/2019 | Emira | H03M 1/466 |
| 10,630,310 B1 * | 4/2020 | Litjes | H03M 1/462 |
| 11,265,008 B2 * | 3/2022 | Alhoshany | H03M 3/426 |
| 11,658,675 B2 * | 5/2023 | Chen | H03M 1/804 |
| | | | 341/172 |
| 11,888,497 B2 * | 1/2024 | Sahu | H03M 1/0626 |
| 12,537,539 B2 * | 1/2026 | Kim | H03M 1/145 |
| 2005/0123072 A1 * | 6/2005 | Guimaraes | H03M 3/356 |
| | | | 375/319 |
| 2010/0079317 A1 * | 4/2010 | Feddeler | H03M 1/1071 |
| | | | 341/120 |
| 2016/0329867 A1 | 11/2016 | Lesso | |
| 2017/0250699 A1 * | 8/2017 | Fuchs | H03M 1/466 |
| 2019/0074845 A1 | 3/2019 | Nakamura | |
| 2019/0115931 A1 | 4/2019 | Hurwitz | |
| 2019/0166325 A1 * | 5/2019 | Kim | H03M 1/466 |
| 2019/0190529 A1 | 6/2019 | Baker | |
| 2020/0127676 A1 | 4/2020 | Wang | |
| 2021/0297088 A1 * | 9/2021 | Ikada | H03M 1/462 |

* cited by examiner

SUCCESSIVE APPROXIMATION REGISTER ANALOG-TO-DIGITAL CONVERTER WITH EMBEDDED FILTERING

CROSS-REFERENCE TO RELATED APPLICATIONS

This application is a continuation of U.S. patent application Ser. No. 17/893,076, filed Aug. 22, 2022, which is a continuation of U.S. patent application Ser. No. 17/007,887, filed Aug. 31, 2020, now U.S. Pat. No. 11,424,756, which applications are hereby incorporated herein by reference.

BACKGROUND

Wireless local area networks (WLANs), including WLANs based on an IEEE 802.11 standard, provide communication between electronic devices. The radios in electronic devices that communicate via a WLAN may consume a significant amount of power. To reduce power consumption, some electronic devices include a wake-up radio in addition to the main radio. Power consumption of the wake-up radio may be much lower than that of the main radio. The electronic device may turn off the main radio to conserve power, and use the wake-up radio to receive transmitted packets that trigger activation of the main radio. Electronic devices powered by limited power sources, such as batteries, may benefit from use of a wake-up radio to extend operating life.

SUMMARY

A successive approximation register (SAR) analog-to-digital converter (ADC) for use in a wireless local area network (WLAN) wake-up radio is disclosed herein. The SAR ADC provides digital sample feedback to a capacitive digital-to-analog converter (CDAC) to form an infinite impulse response (IIR) filter that attenuates blocking signals. In one example, an ADC includes a comparator having an input and an output, a control circuit, and a switched capacitor circuit. The control circuit includes a digital sample register having an input and an output, a SAR, and a selector circuit. The SAR has an input coupled to the output of the comparator, has a first output coupled to the input of the digital sample register, and has a second output. The selector circuit has a first input coupled to the output of the digital sample register, has a second input coupled to the second output of the SAR, and has a switch control output. The control circuit provides switch control signals at the switch control output. The switched capacitor circuit has a switch control input coupled to the switch control output, has an output coupled to the input of the comparator, includes capacitors coupled to switches. In a sample acquisition cycle and responsive to the switch control signals, the switched capacitor circuit: samples an analog input signal using a first subset of the capacitors; and charges a second subset of the capacitors based on a digital sample value provided by the ADC prior to the sample acquisition cycle.

In another example, an ADC includes a switched capacitor circuit, a comparator, and a control circuit. The switched capacitor circuit has a switch control input and an output, and includes switches coupled to the switch control input and coupled to capacitors. The comparator has an input coupled to the output of the switched capacitor circuit and has an output. The control circuit has a switch control output coupled to the switch control input, has an input coupled to the output of the comparator, and provides switch control signals at the switch control output. Responsive to the switch control signals, the switched capacitor circuit provides an output signal to the comparator that is based on a sample of an analog input signal acquired in a sample acquisition cycle and based on a digital sample value output by the ADC prior to the sample acquisition cycle.

In another example, a receiver includes a mixer circuit coupled to an ADC. The mixer circuit down converts a received radio frequency signal and provides a down-converted analog signal. The ADC is coupled to the mixer circuit, digitizes the down-converted analog signal, and includes: a switched capacitor circuit including switches coupled to capacitors; a comparator coupled to the switched capacitor circuit; and a control circuit coupled to the switched capacitor circuit and to the comparator, and provides switch control signals in a sample acquisition cycle of the ADC. Responsive to the switch control signals, the switched capacitor circuit provides, to in the comparator, an output signal representative of a sample of the down-converted analog signal combined with a digital sample value provided by the ADC prior to the sample acquisition cycle.

BRIEF DESCRIPTION OF THE DRAWINGS

For a detailed description of various examples, reference will now be made to the accompanying drawings in which.

DETAILED DESCRIPTION

The term "couple" may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Also, in this description, the recitation "based on" means "based at least in part on." Therefore, if X is based on Y, then X may be a function of Y and any number of other factors.

The IEEE 802.11ba standard specifies a wireless receiver that includes a low-power wake-up radio. The wake-up radio must operate in the presence of blocking signals generated by nearby devices. Applications of the wireless receiver are generally cost sensitive, so the circuit area of the wake-up radio must be small to reduce cost. The wake-up radio includes a successive approximation register (SAR) analog-to-digital converter (ADC) to digitize received radio frequency signals. The dynamic range, power consumption, and cost of the SAR ADC can be reduced if the blocking signals are filtered from the received radio frequency signals (the signals to be digitized). Some wake-up radio implementations include a resistor capacitor filter to attenuate the blocking signals. However, the resistors and capacitors used in some examples to filter the blocking signals consume substantial die area, which increases circuit size and cost.

The wireless radios of the present disclosure attenuate blocking signals without inclusion of dedicated passive or active filters. The wake-up radios disclosed herein include a SAR ADC that implements an embedded infinite impulse response (IIR) filter to attenuate blocking signals. The IIR is implemented within the SAR ADC using digital sample feedback to the capacitive digital-to-analog converter (CDAC) of the SAR ADC. Thus, the wake-up radios attenuate blocking signals without the additional circuit area, cost, and power consumption of a discrete filter.

Figures 1, 3:
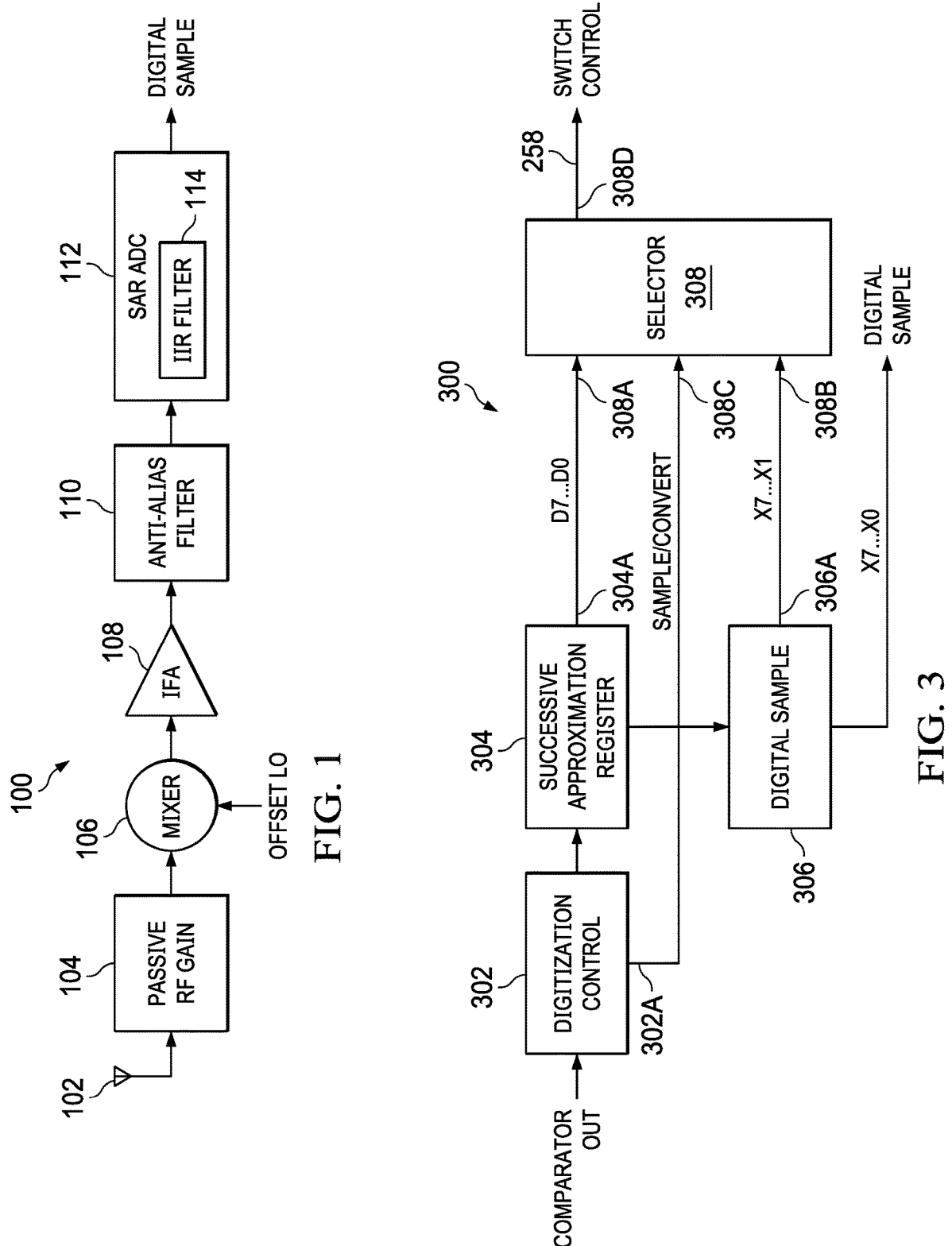
FIG. 1 shows a block diagram for a portion of a wake-up receiver in accordance with this description.
FIG. 3 shows a block diagram for a SAR control circuit configured to implement an embedded IIR in a SAR ADC in accordance with this description.

FIG. 1 shows a block diagram for a portion of a wake-up receiver 100 in accordance with this description. The wake-up receiver 100 includes an antenna 102, passive radio frequency (RF) gain circuitry 104, a mixer 106, an intermediate frequency amplifier 108, an anti-alias filter 110, and a SAR ADC 112. The antenna 102 converts RF signals from airwave to conducted form. The antenna 102 is coupled to the passive RF gain circuitry 104, and RF signals detected by the antenna 102 are provided to the passive RF gain circuitry 104. The passive RF gain circuitry 104 applies gain to the detected signals. The RF signal output of the passive RF gain circuitry 104 is provided to the mixer 106.

The mixer 106 down converts the RF signals to an intermediate frequency range. The down conversion includes mixing the received RF signals with a local oscillator signal (e.g., multiplying the RF signals by the local oscillator signal). The intermediate frequency output of the mixer 106 is provided to and amplified by the intermediate frequency amplifier 108.

The output of the intermediate frequency amplifier 108 is low pass filtered by the anti-alias filter 110 to limit the bandwidth of signal provided to the SAR ADC 112 to a range that prevents aliasing in the SAR ADC 112. The SAR ADC 112 digitizes the output of the anti-alias filter 110. In the process of sampling the output of the anti-alias filter 110, the SAR ADC 112 implements an embedded IIR filter 114. The embedded IIR filter 114 attenuates blocking signals generated by other devices operating in the vicinity of the wake-up receiver 100. Implementation of the embedded IIR filter 114 reduces the die area of the wake-up receiver 100, relative to implementations of a wake-up receiver that includes a resistor-capacitor or active filter separate from the SAR ADC 112.

Figure 2:
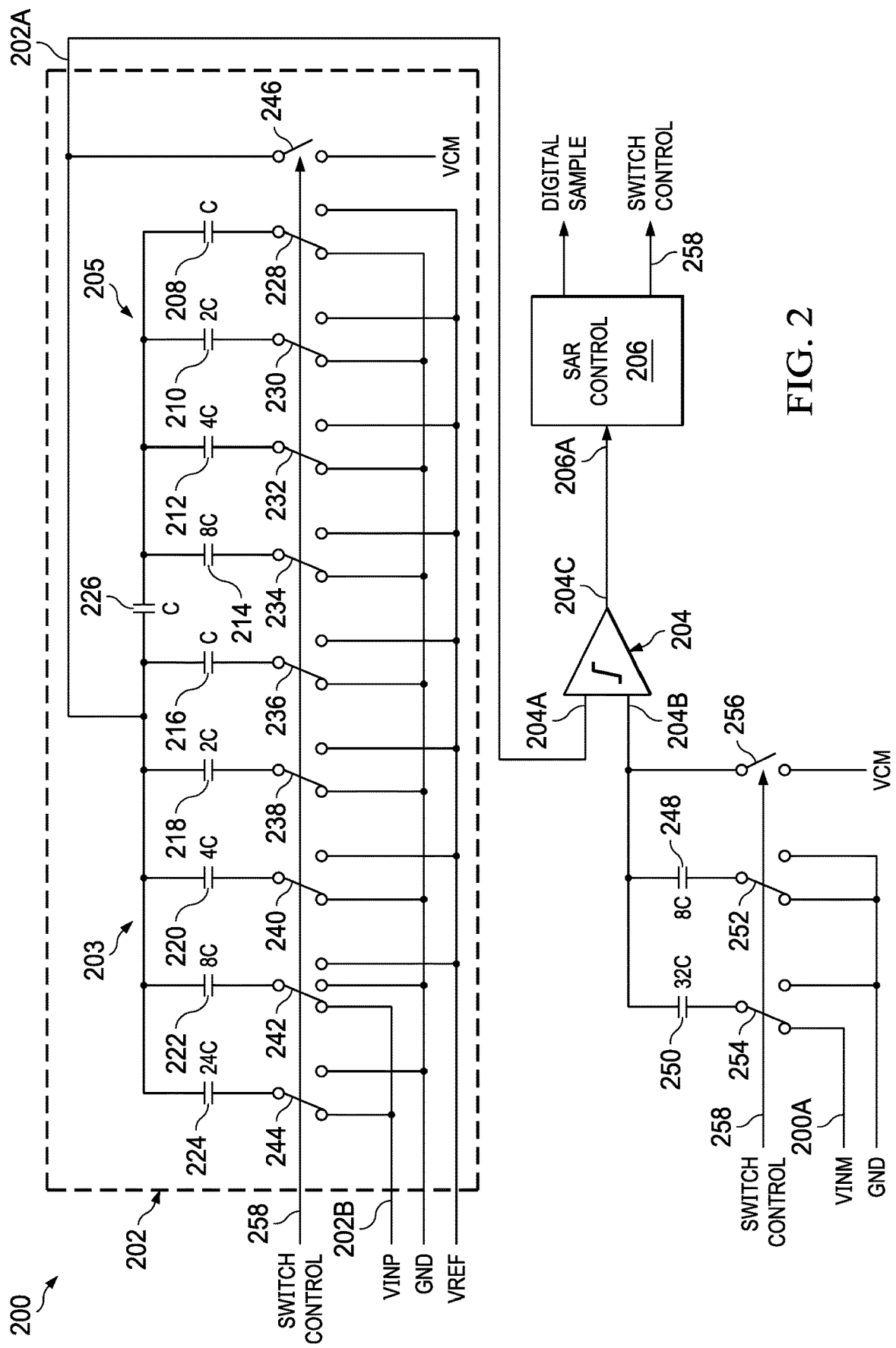
FIG. 2 shows a block diagram for a successive approximation register (SAR) analog-to-digital converter (ADC) that includes an embedded infinite impulse response (IIR) filter in accordance with this description.

FIG. 2 shows a block diagram for a successive approximation register (SAR) analog-to-digital converter (ADC) 200 that includes an embedded IIR filter in accordance with this description. The SAR ADC 200 is an implementation of the SAR ADC 112. The SAR ADC 200 includes a CDAC 202, a comparator 204, and a SAR control circuit 206. The comparator 204 compares output voltage of the CDAC 202 to the voltage on the top plate of the capacitor 250 and capacitor 248 to provide bit decision information to the SAR control circuit 206. The comparator 204 includes an input terminal 204A (e.g., a non-inverting input terminal) coupled to an output terminal 202A of the CDAC 202, an input terminal 204B (e.g., an inverting input terminal) coupled to a top plate of the capacitor 250 and a top plate of the capacitor 248. An output terminal 204C of the comparator 204 is coupled to an input terminal 206A of the SAR control circuit 206.

The CDAC 202 includes a plurality of capacitors 208-224. The capacitors 216, 218, 220, 222, and 224 form an MSB stage 203, and the capacitors 208, 210, 212, and 214 form an LSB stage 205. The MSB stage 203 is coupled to the LSB stage 205 via a bridge capacitor 226. The capacitors 208-222 form a binary weighted capacitor array that presents binary weighted capacitance at the output terminal 202A. The capacitance presented at the output terminal 202A by the capacitors 208-214 is scaled by the bridge capacitor 226 to provide the binary weighting relative to the capacitors 216-222. The voltages applied to the binary weighted capacitors 208-222 are switched in the binary search process controlled by the SAR control circuit 206 to determine digital sample bit values. The capacitor 224 is a sampling capacitor having a capacitance that is greater than (a multiple of) the capacitance of the largest capacitor of the binary weighted capacitor array. For example, the capacitor 224 may have a capacitance that is about three times that of the largest binary weighted capacitance.

The bottom plates of the capacitors 208-224 are coupled to switches 228-244. The SAR control circuit 206 controls the switches 228-244, via the switch control signals 258, to sample input voltage to be digitized and execute the binary search for the digital sample value corresponding to a sampled analog signal. The switches 228, 230, 232, and 234 are respectively coupled to the capacitors 208, 210, 212, and 214 to switchably couple the bottom plates of the capacitors 208-214 to a reference voltage (VREF) or ground (GND) as selected by the SAR control circuit 206. Similarly, the switches 236, 238, 240, and 242 are respectively coupled to the capacitors 216, 218, 220, and 222 to switchably couple the bottom plates of the capacitors 208-214 to a reference voltage (VREF) or ground (GND) as selected by the SAR control circuit 206.

The switch 244 is coupled to the capacitor 224 to switchably couple the bottom plate of the capacitor 224 to an analog signal input 202B or ground as selected by the SAR control circuit 206. The switch 242 also couples the capacitor 222 to the analog signal input 202B, under control of the SAR control circuit 206, for sampling an analog input signal. Thus, the switches 242 and 244 (first subset of the switches of the CDAC 202) connect the capacitors 222 and 224 (first subset of the capacitors of the CDAC 202) to the analog signal input 202B.

The bottom plate of the capacitor 250 is coupled to the switch 254, which is controlled by the SAR control circuit 206 to connect the bottom plate of the capacitor 250 to an analog signal input terminal 200A (VINM input terminal) or ground. The switch 254 connects the bottom plate of the capacitor 250 to the analog signal input terminal 200A for sampling, and connects the bottom plate of the capacitor 250 to ground for digitization of the acquired sample. The switch 252 connects the bottom plate of the capacitor 248 to ground for sampling and digitization.

The top plates of the capacitors 216-224 are coupled to the switch 246, which is controlled by the SAR control circuit 206 to connect the top plates to a common mode reference voltage (e.g., ground). Similarly, the top plates of the capacitors 248 and 250 are coupled to the switch 256 which is controlled by the SAR control circuit 206 to connect the top plates to the common mode reference voltage (VCM).

The SAR control circuit 206 controls the switches 228-246 and 252-256 to sample and digitize an analog input signal. In a sample acquisition phase, the SAR control circuit 206 controls the switches 246 and 256 to connect the capacitor top plates to the common mode reference voltage, and controls the switch 244 and the switch 242 to capture a sample of the analog input signal (VINP) on the capacitor 222 and the capacitor 224. In the sample acquisition phase, the SAR control circuit 206 also controls the switches 228-240 to connect the bottom plates of the capacitors 208-220 to VREF and GND in a pattern of a digital sample last generated by the SAR ADC 200. Thus, the SAR control circuit 206 provides a feedback signal (a last generated digital sample) to the CDAC 202. The capacitors 208-220 of the CDAC 202 are charged based on the feedback signal for summation with the sample voltage captured on the capacitor 222 and the capacitor 224. Such operation of the SAR ADC 200 may be expressed as:

$$y[n]=x[n]+a*y[n-1]$$

where:

y[n] is the new digital sample value;

x[n] is the currently sampled analog signal value;

y[n−1] is the last digital sample value; and a is a scaling coefficient applied to y[n−1].

a may have a value of 0.5 or 0.25 in various implementations of the SAR ADC 200, where a is applied to y[n−1] by right-shifting y[n−1] by one or two bits and discarding the least significant bits. For example, in the SAR ADC 200, if a=0.5, the SAR control circuit 206 sets the switch 240 to present the MSB of y[n−1] on the bottom plate of the 220 (i.e., y[n−1] is right-shifted by one bit).

Feeding back the last generated sample to the CDAC 202 forms an embedded IIR filter, which may be expressed as:

$$\frac{Y(z)}{X(z)} = \frac{1}{1 - a*z^{-1}}$$

Thus, in the SAR ADC 200, the CDAC 202 and the SAR control circuit 206 are applied to provide an implementation of the embedded IIR filter 114.

Implementations of the IIR filter 114 are also applicable to differential implementations of the SAR ADC 112. For example, in a differential implementation of the SAR ADC 200, an instance of the CDAC 202 is coupled to the input terminal 204B of the comparator 204. In the differential implementation of the SAR ADC 200, the inverse of the last generated sample is fed back to the instance of the CDAC 202 coupled to the input terminal 204B of the comparator 204, and the non-inverted last generated sample is fed back to the CDAC 202 coupled to the input terminal 204A of the comparator 204.

FIG. 3 shows a block diagram for a SAR control circuit 300 configured to implement an embedded IIR in a SAR ADC in accordance with this description. The SAR control circuit 300 is an implementation of the SAR control circuit 206. The SAR control circuit 300 includes a digitization control circuit 302, a successive approximation register 304, a digital sample register 306, and a selector circuit 308. The digitization control circuit 302 controls sampling and digitization of an analog input signal. In the digitization phase, the digitization control circuit 302 successively sets/resets the bits of the successive approximation register 304 based on the output of the comparator 204 as each bit is tested. The digitization control circuit 302 may be implemented as a finite state machine configured to perform a binary search in the digitization phase, and implement the embedded IIR in the sampling phase.

At completion of the digitization phase, the successive approximation register 304 contains a digital sample value corresponding to the analog input signal. The digital sample value is stored in the digital sample register 306.

The selector circuit 308 selects the output of the successive approximation register 304 or the output of the digital sample register 306 to control the switches 228-240 (second subset of the switches) of the CDAC 202 based on a sample/convert signal generated by the digitization control circuit 302. In the sample acquisition phase, the selector circuit 308 selects and routes the digital sample value output by the digital sample register 306 to control the switches 228-240. In the sample digitization phase, the selector circuit 308 selects and routes the output of the successive approximation register 304 to control the switches 228-242. For example, in the SAR control circuit 300, the eight-bit digital sample output of the digital sample register 306 is designated X7 . . . X0. X7 . . . X0 is right shifted by one bit and X7 . . . X1 are applied to control the switches 228-240 of the CDAC 202 in the sample acquisition phase. The switch control may cause the switch 240 to connect the bottom plate of the 220 to VREF if X7 is a logic "1," and connect the bottom plate of the 220 to GND if X7 is a logic "0," and so on for each of the switches 228-240 thereby providing the value of X7 . . . X1 on the bottom plates of the capacitors 208-220 in the sample acquisition phase.

The selector circuit 308 includes an input 308A coupled to an output 304A of the successive approximation register 304, an input 308B coupled to an output 306A of the digital sample register 306, and a select input 308C coupled to an output 302A of the digitization control circuit 302. An output 308D of the selector circuit 308 is coupled to the switches 228-246 and 252-256 of the CDAC 202. Switch control signals 258 are provided at output 308D of the selector circuit 308.

Figure 4:
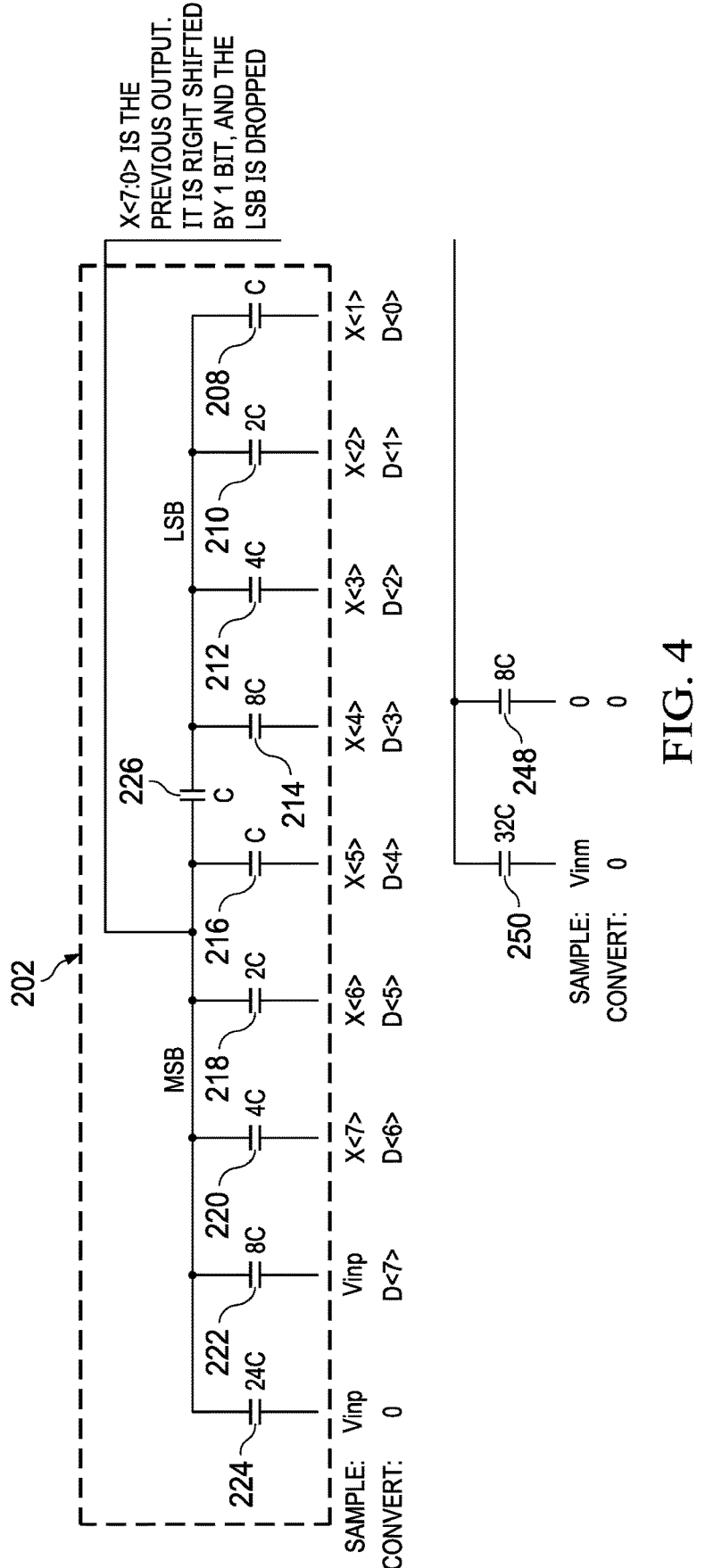
FIG. 4 shows inputs to the capacitive digital-to-analog converter (CDAC) of a SAR ADC that in includes an embedded IIR filter in accordance with this description.

FIG. 4 more succinctly illustrates SAR control circuit 206 control of the CDAC 202 in sample acquisition and digitization phases. In the sample acquisition phase, the SAR control circuit 206 sets the switches 244 and 242 to sample the analog input signal (VINP), and sets the switches 228-240 to produce the values of the bits X7 . . . X1 of the last generated digital sample value on the bottom plates of the capacitors 208-220, thereby producing a sum of the sampled analog input signal and one-half the last generated digital sample value at the output terminal 202A of the CDAC 202. In the digitization phase, the SAR control circuit 206 sets the switch 244 to ground the bottom plate of the capacitor 224, and sets the switches 228-242 based on the values of the bits D7 . . . D0 of the successive approximation register 304 select the bits of the new digital sample value.

Figure 5:
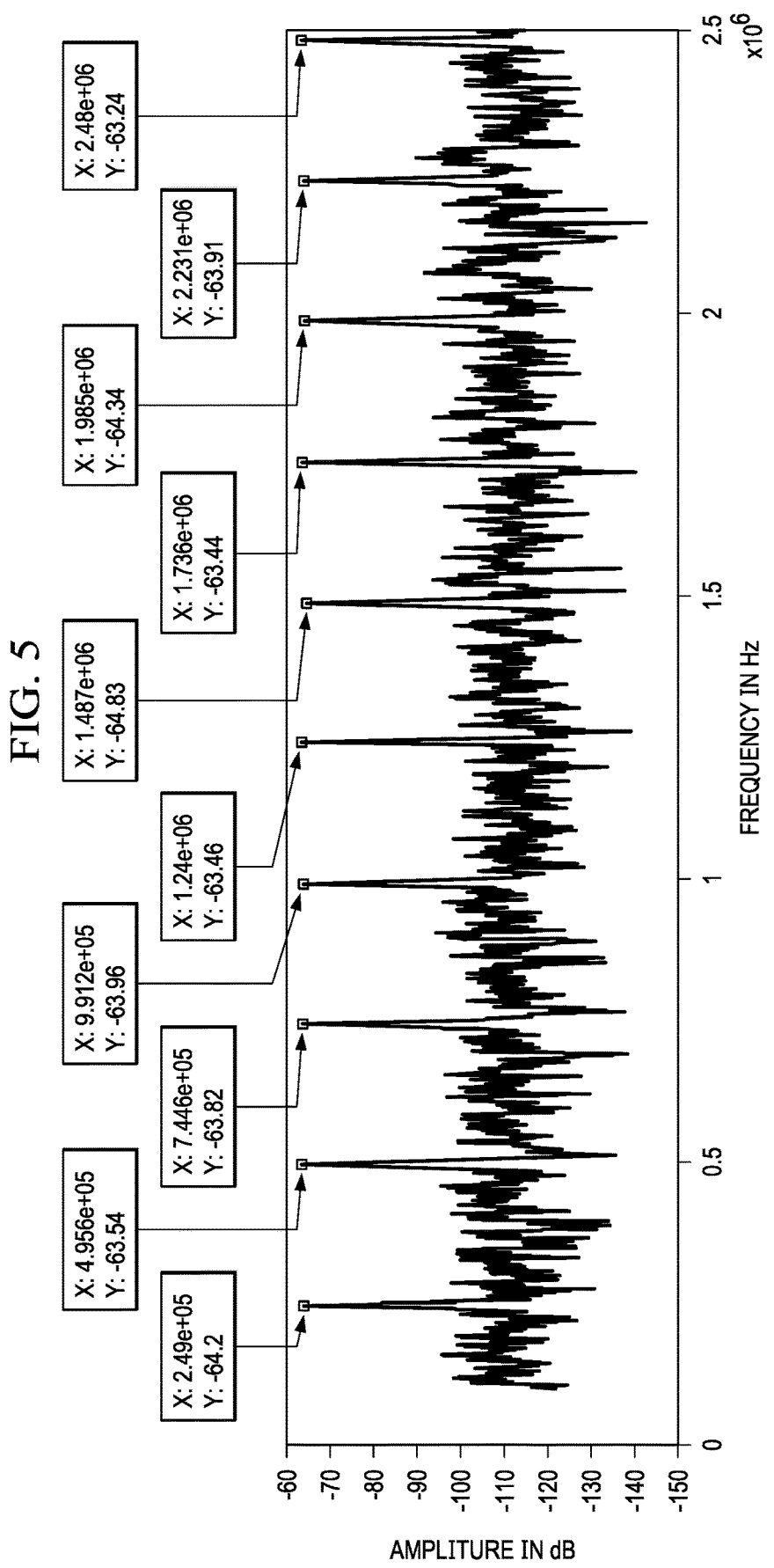
FIG. 5 shows signal power in a wake-up receiver that lacks filtering of blocking signals.
Figure 6:
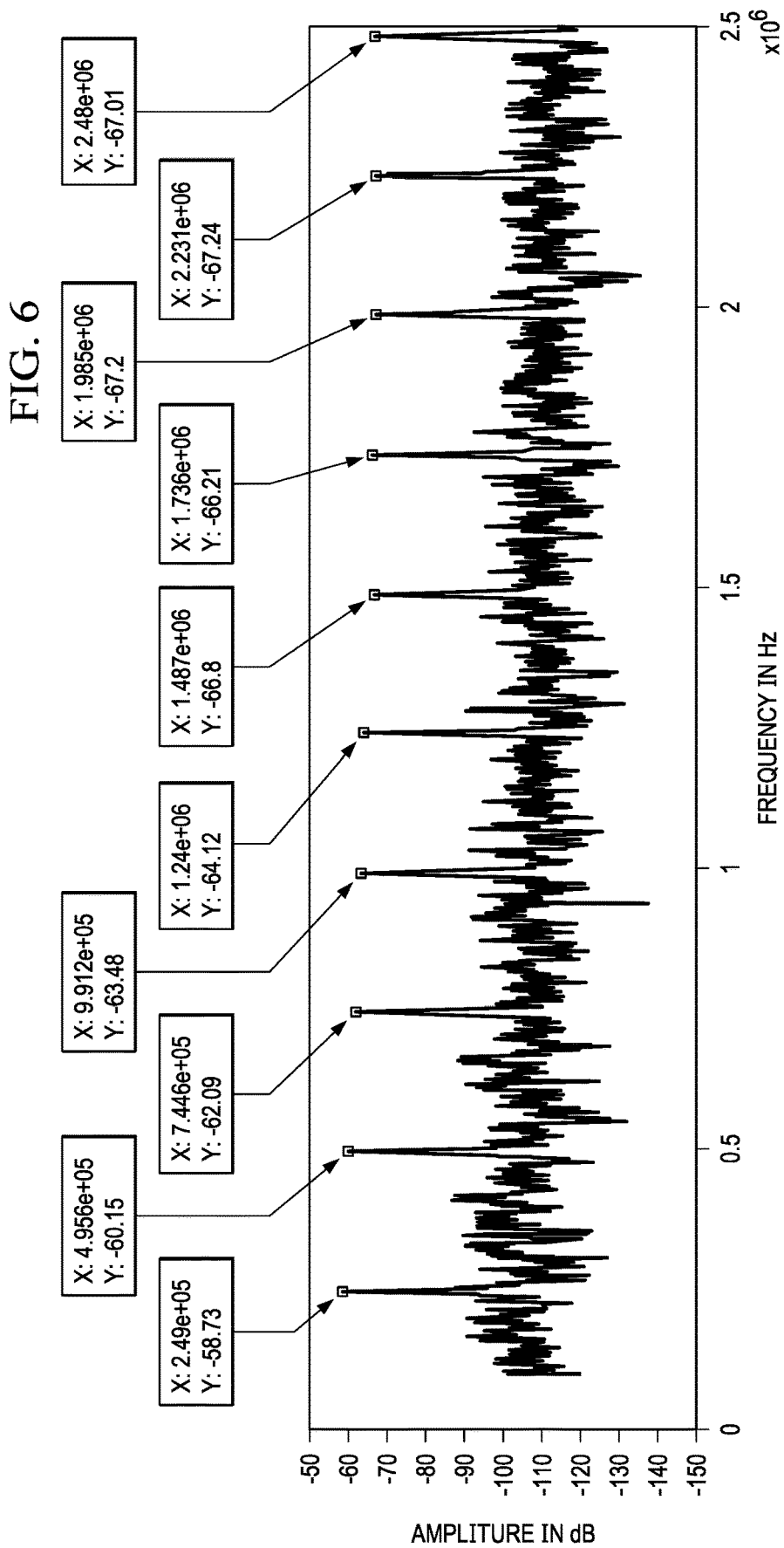
FIG. 6 shows signal power in a wake-up receiver that include a SAR ADC that implements an embedded IIR filter in accordance with this description.

FIGS. 5 and 6 show signal power in a wake-up receiver that lacks filtering of blocking signals and in a wake-up receiver that includes a SAR ADC that implements an embedded IIR filter in accordance with this description. FIG. 5 shows that without filtering signal power is generally constant up to 2.5 megahertz (MHz). FIG. 6 shows that in a wake-up receiver incorporating the SAR ADC 200, signal power is attenuated by about 8.3 decibels at 2.5 MHz The attenuation provided by the embedded IIR allows for the size and cost of the wake-up radio to be reduced relative to wake-up radio implementations that lack that lack the embedded IIR.

Modifications are possible in the described embodiments, and other embodiments are possible, within the scope of the claims.

What is claimed is:

1. A device comprising an analog-to-digital converter (ADC) comprising:
   an input terminal configured to receive an input analog signal, wherein the ADC is configured to sample the input analog signal during a sampling phase of the ADC;
   a digital-to-analog converter (DAC);
   a comparator having an input coupled to the DAC, and an output;
   a first register having an output, wherein the first register is configured to include, at an end of a conversion phase of the ADC, a digital sample value corresponding to the sampled analog input signal;
   a second register having an output, wherein a content of the second register during the sampling phase of the ADC corresponds to the digital sample value stored on the first register during a previous conversion phase of the ADC; and
   a selector circuit having an output coupled to the DAC and configured to:
      route the output of the second register to the DAC during the sampling phase of the ADC; and
      route the output of the first register to the DAC during the conversion phase of the ADC.

2. The device of claim 1, wherein the output of the second register includes a right-shifted version of the digital sample value stored on the first register during the previous conversion phase of the ADC.

3. The device of claim 1, wherein the digital sample value stored in the first register is given by $$y[n]=x[n]+a^*y[n-1],$$

wherein y[n] represents the digital sample value stored, x[n] represents the sampled analog input signal, y[n−1] represents the digital sample value stored on the first register during the previous conversion phase of the ADC; and a represents a scaling coefficient.

4. The device of claim 3, wherein a is equal to 0.25 or 0.5.

5. The device of claim 1, wherein the ADC comprises a control circuit configured to, during the conversion phase, set bits of the first register based on the output of the comparator.

6. The device of claim 5, wherein the control circuit comprises an output coupled to a selection input of the selector circuit.

7. The device of claim 1, wherein the DAC is a capacitive DAC (CDAC) comprising a plurality of capacitors.

8. The device of claim 7, wherein the plurality of capacitors forms a binary weighted capacitor array.

9. The device of claim 7, wherein the CDAC comprises a bridge capacitor coupled between a first set of the plurality of capacitors and a second set of the plurality of capacitors.

10. The device of claim 7, wherein the CDAC comprises a plurality of switches respectively coupled to the plurality of capacitors, wherein, during the sampling phase of the ADC, the plurality of switches are configured to be controlled based on the output of the second register, and wherein, during the conversion phase of the ADC, the plurality of switches are configured to be controlled based on the output of the first register.

11. The device of claim 1, wherein the ADC is a differential successive approximation register (SAR) ADC.

12. The device of claim 1, further comprising a first radio comprising the ADC.

13. The device of claim 12, further comprising a second radio, wherein the first radio is a wake-up radio.

14. The device of claim 12, further comprising an antenna coupled to the first radio, wherein the input terminal of the ADC is configured to receive the analog input signal via the antenna.

15. The device of claim 12, wherein the first radio comprises:
   a mixer having an output;
   an amplifier having an input coupled to the output of the mixer, and an output; and
   an anti-alias filter having an input coupled to the output of the amplifier, and an output coupled to the input terminal of the ADC.

16. The device of claim 1, wherein the DAC comprises an input configured to receive the analog input signal, and wherein the DAC is configured to sample the input analog signal during the sampling phase.

17. A method comprising:
   receiving an input analog signal with an analog-to-digital converter (ADC) that alternates between a sampling phase and a conversion phase, the ADC comprising:
      a digital-to-analog converter (DAC),
      a comparator having an input coupled to the DAC, and an output,
      a first register having an output, and
      a second register having an output;
   during the sampling phase of the ADC,
      sampling the input analog signal, and
      routing the output of the second register to the DAC; and
   during the conversion phase,
      setting bits of the first register based on the output of the comparator so that, at an end of the conversion phase of the ADC, the first register includes a digital sample value corresponding to the sampled analog input signal, and
      routing the output of the first register to the DAC, wherein a content of the second register during the sampling phase of the ADC corresponds to the digital sample value stored on the first register during a previous conversion phase of the ADC.

18. The method of claim 17, wherein the digital sample value stored in the first register is given by $$y[n]=x[n]+a^*y[n-1],$$

wherein y[n] represents the digital sample value stored, x[n] represents the sampled analog input signal, y[n−1] represents the digital sample value stored on the first register during the previous conversion phase of the ADC; and a represents a scaling coefficient.

19. The method of claim 17, wherein the DAC is a capacitive DAC (CDAC) comprising a plurality of capacitors and a plurality of switches respectively coupled to the plurality of capacitors, the method further comprising:
   during the sampling phase of the ADC, controlling the plurality of switches based on the output of the second register to the DAC; and
   during the conversion phase of the ADC, controlling the plurality of switches based on the output of the first register to the DAC.

20. The method of claim 17, wherein a radio comprises the ADC, the method further comprising using the radio for wireless communications in accordance with an IEEE 802.11 protocol.

* * * * *